United States Patent [19]

Azuma et al.

[11] Patent Number: 5,546,058
[45] Date of Patent: Aug. 13, 1996

[54] FEEDTHROUGH LC FILTER WITH A DEFORMATION PREVENTING SPRING

[75] Inventors: Takahiro Azuma; Hiromichi Tokuda; Toshimi Kaneko, all of Nagaokakyo, Japan

[73] Assignee: Murata Manufacturing Co., Ltd., Nagaokakyo, Japan

[21] Appl. No.: 361,492

[22] Filed: Dec. 22, 1994

[30] Foreign Application Priority Data

Dec. 24, 1993 [JP] Japan ................................ 5-328170

[51] Int. Cl.$^6$ ................................................ H03H 7/01
[52] U.S. Cl. ..................... 333/183; 333/185; 361/302; 439/620; 439/825
[58] Field of Search .................... 333/167, 182, 333/183, 184, 185; 361/302; 439/620, 751, 825, 826, 827, 862

[56] References Cited

U.S. PATENT DOCUMENTS 4,247,881  1/1981  Coleman ............................... 361/302
4,556,267  12/1985  Senor ................................. 439/862 X
4,700,155  10/1987  Sakamoto et al. .................. 439/620 X
4,908,590  3/1990  Sakamoto et al. ...................... 333/183

FOREIGN PATENT DOCUMENTS 1-262616  10/1989  Japan ................................. 361/302

Primary Examiner—Benny Lee
Assistant Examiner—Justin P. Bettendorf
Attorney, Agent, or Firm—Burns, Doane, Swecker & Mathis, L.L.P.

[57] ABSTRACT

A feedthrough electronic device which has an electronic element with a feedthrough hole and a center conductor which penetrates the electronic element. The center conductor is composed of a lead line portion and a spring portion which protrudes from the lead line portion and contacts with an inner periphery of the electronic element with pressure. A wide portion for preventing deformation is provided at the spring portion. A ferrite bead, a doughnut-shaped capacitor or a tubular capacitor can be used as the electronic element which has a feedthrough hole. The lead line portion of the center conductor and the spring portion can be produced separately or integrally.

11 Claims, 6 Drawing Sheets

F I G. 1
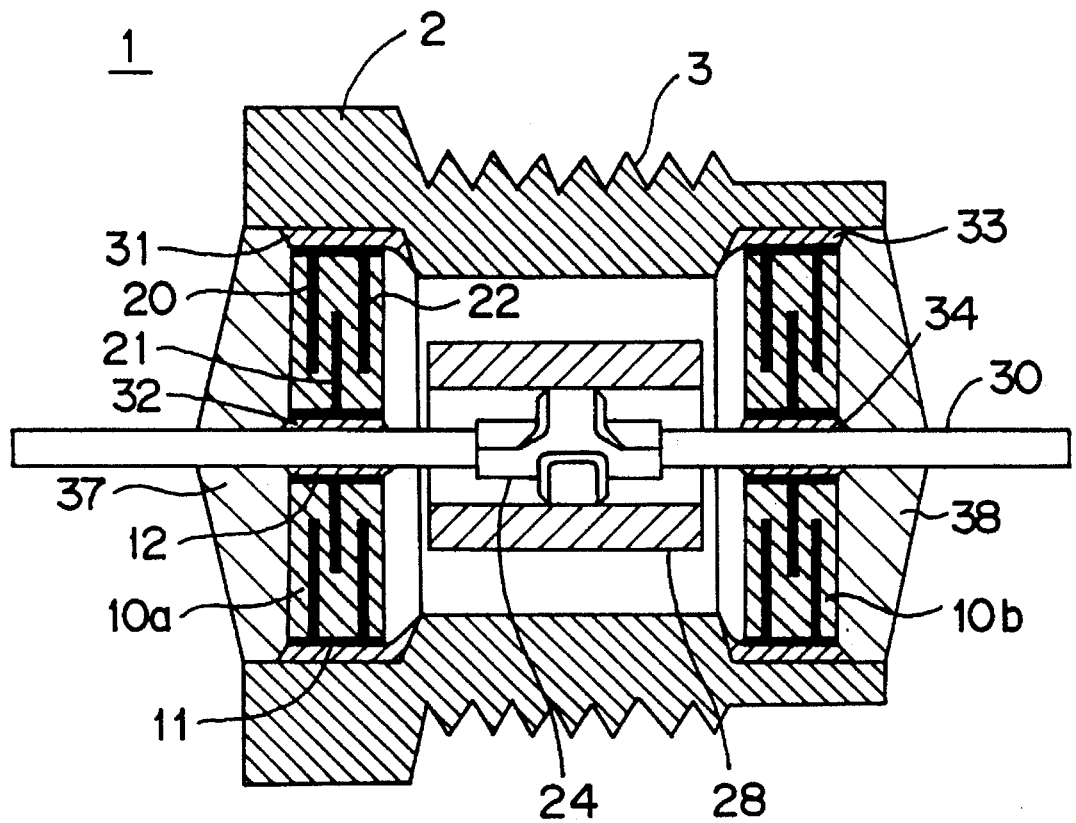
F I G. 2
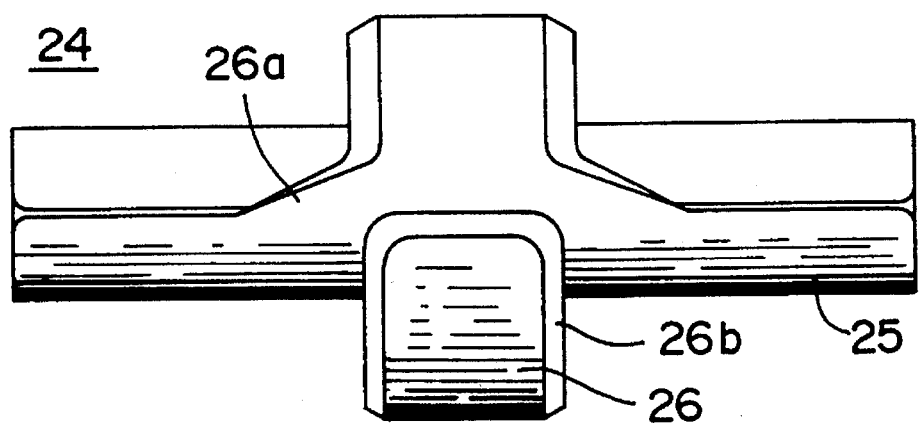

F I G. 10
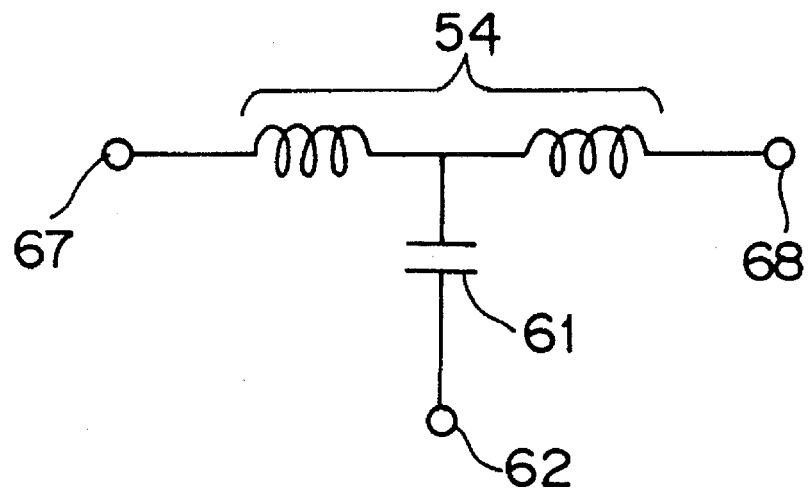

FEEDTHROUGH LC FILTER WITH A DEFORMATION PREVENTING SPRING

BACKGROUND OF THE INVENTION

1. Field of the Invention

The present invention relates to a feedthrough electronic device which is used for composing various electronic circuits, such as a feedthrough LC filter and a feedthrough capacitor.

2. Description of Related Art

Conventionally, a feedthrough electronic device, which has a feedthrough hole in which a center conductor penetrates is known. The center conductor is composed of a lead line terminal and a spring member 70 shown in FIGS. 11 and 12. The spring member 70 has a cylinder portion 71 which is wound around the lead line terminal tightly and an extended portion 72 which is extended from the cylinder portion 71. The extended portion 72 contacts with an inner periphery of the electronic element, and the center conductor and the electronic element are fixed by this spring power of the extended portion 72. Conventionally, a center conductor wherein a lead line terminal and a spring member are formed in a body has also been used.

However, if the spring member 70 which has such a structure is press-fitted to the electronic element with being connected with the lead line terminal, as shown in FIG. 13, the extended portion 72 may not be able to resist the pressure generated between the extended portion 72 and the inner periphery of the electronic element and may be deformed. Especially, when a length of the electronic element is short, a width of the extended portion 72 becomes narrow accordingly. Thereby, the extended portion 72 is easily deformed. The deformation of the extended portion 72 lowers the pressure generated between the extended portion 72 and the inner periphery of the electronic element. Thus, holding the electronic element by the center conductor becomes unstable.

SUMMARY OF THE INVENTION

An object of the present invention is to provide a feedthrough electronic device wherein deformation of an extended portion is difficult to occur and an electronic element is surely kept by a center conductor.

In order to attain the object, a feedthrough electronic device according to the present invention comprises an electronic element with a feedthrough hole and a center conductor which penetrates the electronic element and is composed of a lead line portion and a spring portion, the spring portion having an extended portion which protruded from the lead line portion and contacts with an inner periphery of the electronic element with pressure, and the extended portion is provided with a wide portion for preventing deformation. For example, a ferrite bead, a doughnut-shaped capacitor and a tubular capacitor are used as the electronic element.

In the above structure, since the extended portion is provided with the wide portion for preventing deformation, the extended portion has strength to resist a pressure applied to the extended portion when the center conductor is press-fitted into the electronic element. Thus, when the center conductor is press-fitted into the electronic element, the deformation of the extended portion does not occur.

BRIEF DESCRIPTION OF THE DRAWINGS

This and other objects and features of the present invention will become apparent from the following description with reference to the accompanying drawings, in which:

FIG. 1 is a sectional view which shows a first embodiment of a feedthrough electronic device according to the present invention;

FIG. 2 is an elevational view of a spring member which is used in the feedthrough electronic device shown in FIG. 1;

FIG. 10 is an electric equivalent circuit diagram of the feedthrough electronic device shown in FIG. 7;

DETAILED DESCRIPTION OF THE PREFERRED EMBODIMENTS

Figure 3:
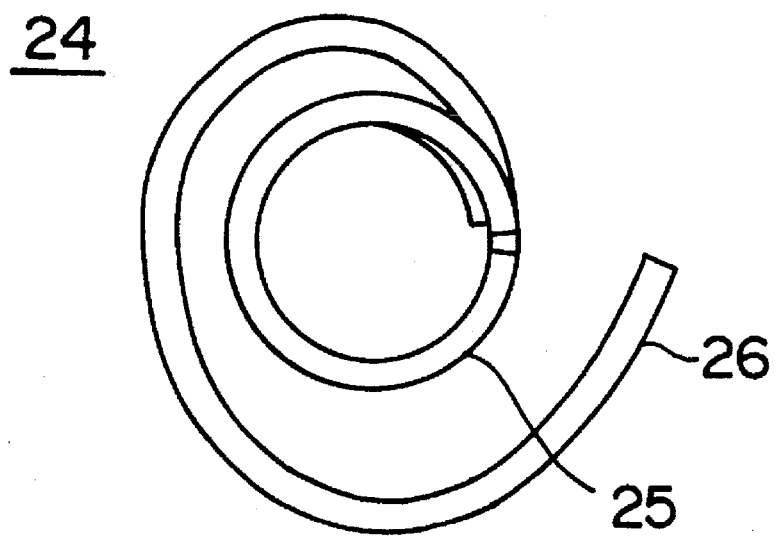
FIG. 3 is a side view of the spring member shown in FIG. 2.

The description of preferred embodiments according to the present invention is given below, referring to the accompanying drawings. In each embodiment, an LC filter is used as an example of a feedthrough electronic device. However, a feedthrough capacitor or the like can also be used as a feed through electronic device.

First Embodiment: FIGS. 1 through 6

As shown in FIG. 1, a feedthrough LC filter 1 is mainly composed of a substantially cylinder metal case 2, two capacitors 10a and 10b which are contained in the metal case 2, a spring member 24 and a lead line terminal 30 which compose a center conductor, and a ferrite bead 28.

A thread groove 3 is formed at an outer peripheral surface of the metal case 2. With using this thread groove 3, the feedthrough LC filter 1 is screwed down into a tapped hole which is provided at a circuit board. Free-cutting steel or the like is used as the material of the metal case 2.

The cylinder-shaped ferrite bead 28 is provided between two capacitors 10a and 10b. The ferrite bead 28 is formed by injecting a mixture of ferrite powder and resin binder in a mold and then sintering the molded mixture. By inserting the lead line terminal 30 into this ferrite bead 28, the lead line terminal 30 obtains a larger inductance.

The spring member 24 is, as shown in FIGS. 2 and 3, composed of a cylinder portion 25 and an extended portion 26 which is extended from the cylinder portion 25. This spring member 24 is made by punching a metal plate in a specified shape and then bending the punched metal plate. After the lead line terminal 30 is inserted through the cylinder portion 25, by tightening the cylinder portion 25 at a specified position of the lead line portion 30, the cylinder portion 25 is wound around the lead line terminal 30 firmly, and thereby, the spring member 24 is installed. A wide portion 26a for preventing deformation is provided at a bottom of the extended portion 26, and the edge 26b of the extended portion 26 is bent. By bending the edge 26b, the mechanical strength of the extended portion 26 is increased, and the deformation of the extended portion 26 is further prevented.

In an example shown in FIGS. 2 and 3, the center conductor is composed of the lead line terminal 30 and the spring member 24 which are produced separately and joined together mechanically. However, it is possible to extend the cylinder portion 25 of the spring member 24 to both sides and to use the extended portions as the lead line terminal. In this case, a process for uniting the lead line terminal 30 and the spring member 24 is not necessary, and the lead line terminal 30 and the spring member 24 never separate.

The center conductor which is composed of the spring member 24 and the lead line terminal 30 is inserted into the ferrite bead 28 until the spring member 24 reaches around the center of the ferrite bead 28. The extended portion 26 contacts with the inner periphery of the ferrite bead 28 with pressure by spring power. At that time, since the extended portion 26 becomes mechanically stronger by the wide portion 26a for preventing deformation, sufficient strength can be obtained to resist pressure between the extended portion 26 and the inner periphery of the ferrite bead 28. Thus, the deformation of the extended portion 26 does not occur. Accordingly, a strong pressure occurs between the extended portion 26 and the inner periphery of the ferrite bead 28, and the ferrite bead 28 can be held surely by the center conductor. In this way, though the length of the ferrite bead 28 is short, the ferrite bead 28 can be held surely by the center conductor. Thus, the downsizing of the feedthrough LC filter is possible.

Figure 4:
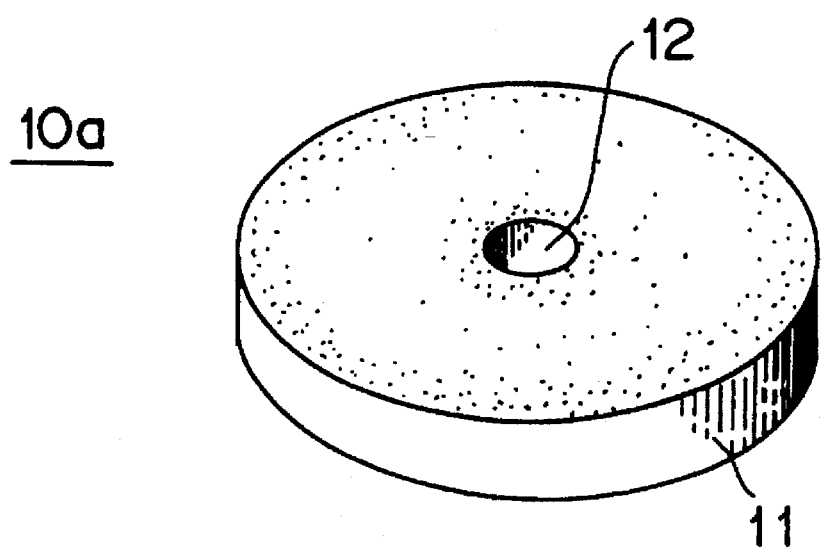
FIG. 4 is a perspective view of a capacitor which is used in the feedthrough electronic device shown in FIG. 1.
Figure 5:
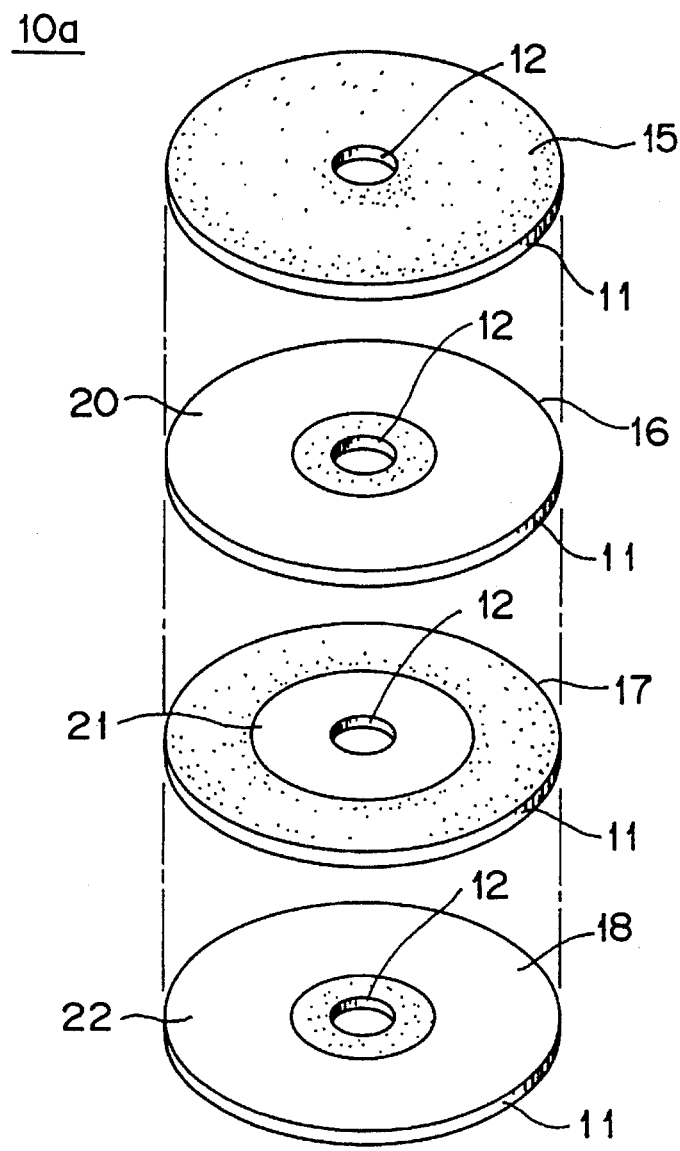
FIG. 5 is an exploded perspective view of the capacitor shown in FIG. 4.

The two capacitors 10a and 10b have the same structure and are provided at openings which are formed at both ends of the metal case 2. As shown in FIG. 4, the capacitors 10a and 10b are doughnut-shaped and have outer periphery electrodes 11 at outer peripheries of the capacitors 10a and 10b and inner periphery electrodes 12 at inner peripheries. As shown in FIG. 5, the capacitors 10a and 10b are made by laminating dielectric sheets 15, 16, 17 and 18 each of which has a hole in the center. Then, the laminated sheets are fired to form the capacitors 10a and 10b. Capacitor electrodes 20, 21 and 22 are provided on surfaces of the dielectric sheets 16 through 18. The capacitor electrodes 20 and 22 are connected electrically with the outer periphery electrode 11, and the capacitor electrode 21 is connected electrically with the inner periphery electrode 12. When the dielectric sheets 15, 16, 17 and 18 are laminated, the capacitor electrodes 20, 21 and 22 form a capacitor.

The lead line terminal 30 penetrates the metal case 2, the capacitors 10a and 10b and the ferrite bead 28 and adheres to the capacitors 10a and 10b. The lead line terminal 30 is connected electrically with the inner periphery electrodes 12 of the capacitors 10a and 10b through solders 32 and 34 respectively, and at the same time adheres to the inner periphery electrodes 12 firmly. Also, the capacitors 10a and 10b are connected with the inner surface of the metal case 2 through solders 31 and 33, and at the same time adheres to the inner surface firmly.

Figure 6:
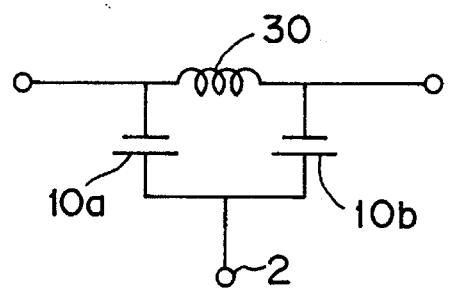
FIG. 6 is an electric equivalent circuit diagram of the feedthrough electronic device shown in FIG. 1.

Both openings of the metal case 2 are sealed with resin 37 and 38, and both ends of the lead line terminal 30 are led from the resin 37 and 38. FIG. 6 is an electric equivalent circuit of the feedthrough LC filter 1 which is obtained in this way.

Second Embodiment: FIGS. 7 through 10

Figure 7:
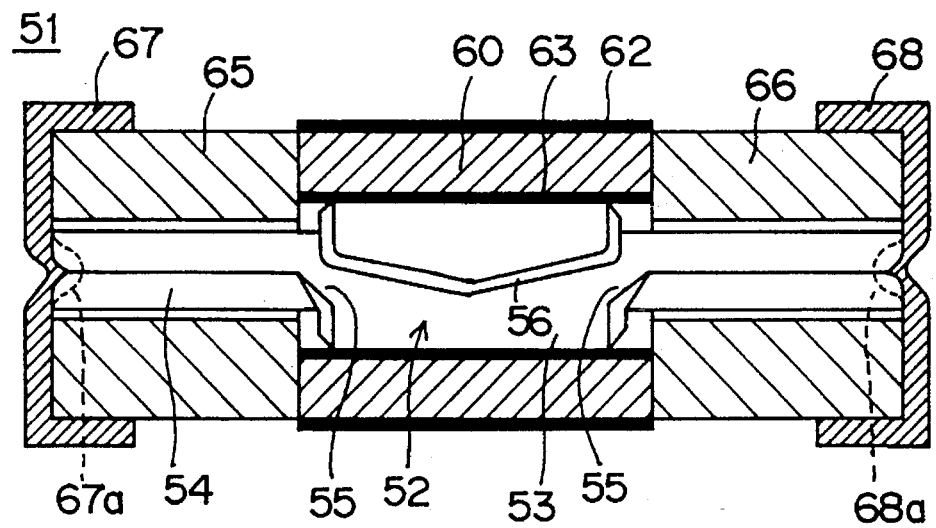
FIG. 7 is a sectional view which shows a feedthrough electronic device which is a second embodiment of the present invention.

As shown in FIG. 7, a feedthrough LC filter 51 is mainly composed of a center conductor 52, a tubular capacitor 60, ferrite beads 65 and 66, and metal caps 67 and 68.

The center conductor 52 is composed of a lead line 54 and a spring portion 53 which is provided at the center of the lead line 54. The center conductor 52 is made by punching a metal plate in a specified shape and bending the punched plate. The lead line 54 is long and narrow cylinder-shaped. The spring portion 53 is extended from this lead line 54 in a peripheral direction, and wound around the lead line 54 substantially once with a space therebetween. A wide portion 55 for preventing deformation is provided at the bottom of the spring portion 53, and the edge 56 of the spring portion 53 is bent. The bent edge portion 56 strengthens the spring portion 53 mechanically and further prevents deformation of the spring portion 53.

Figure 8:
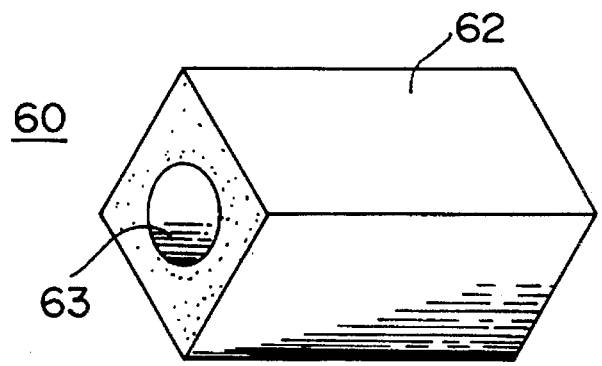
FIG. 8 is a perspective view of a capacitor which is used in the feedthrough electronic device shown in FIG. 7.

The tubular capacitor 60 has, as shown in FIG. 8, a rectangle shape and a cylindrical hole extending in an axis direction. An outer periphery electrode 62 is provided at outer periphery surfaces of the capacitor 60 and an inner periphery electrode 63 is provided at an inner periphery surface. Thereby, the outer periphery electrode 62 and the inner periphery electrode 63 form a capacitor. The outer and inner electrodes 62 and 63 are made of nickel, tin, lead, silver or an alloy of these metals, and formed by metal plating, printing or sputtering.

The ferrite beads 65 and 66 are cylinder-shaped and provided at both sides of the capacitor 60 coaxially. The ferrite beads 65 and 66 are made by molding a mixture of ferrite powder such as iron, nickel, cobalt and zinc and resin binder and sintering the mixture. By inserting the lead line 54 of the center conductor 52 into the ferrite beads 65 and 66, the lead line 54 obtains a larger inductance.

The center conductor 52 is inserted into the capacitor 60 with pressure until the spring portion 53 reaches the position where the spring portion 53 is contained in the capacitor 60. The spring portion 53 contacts with the inner periphery electrode 63 of the capacitor 60 with pressure by its spring power, and connected with the inner periphery electrode 63 electrically. At that time, since the mechanical strength of the spring portion 53 is increased by the wide portion 55 for preventing deformation, the strength enough to resist a pressure between the spring portion 53 and the inner periphery electrode 63 is obtained. Therefore, deformation of the spring portion 53 does not occur. Thus, the capacitor 60 is surely held by the center conductor 52.

Figure 9:
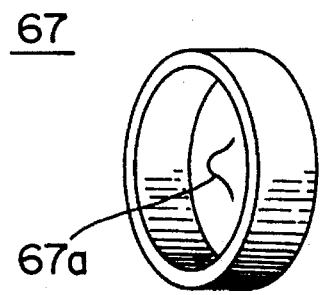
FIG. 9 is a perspective view which shows a metal cap which is used in the feedthrough electronic device shown in FIG. 7.
Figure 11:
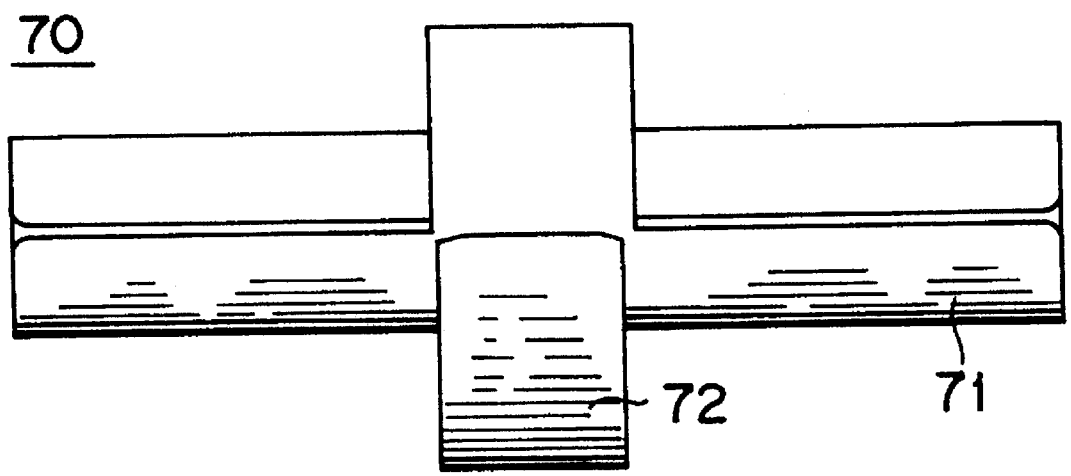
FIG. 11 is an elevational view of a spring member which is used in a conventional feedthrough electronic device.
Figure 12:
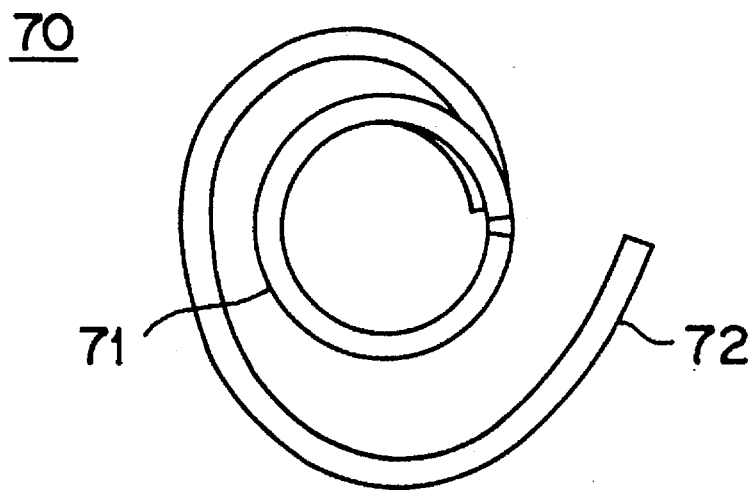
FIG. 12 is a side view of the spring member shown in FIG. 11.
Figure 13:
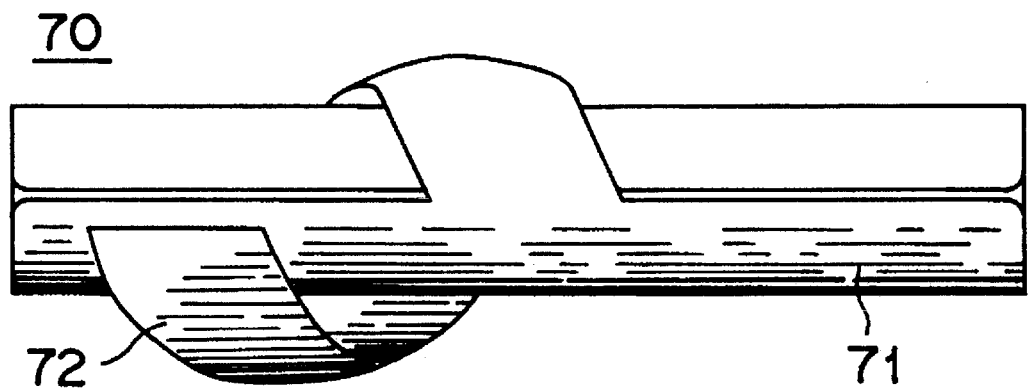
FIG. 13 is an elevational view which shows a deformed extended portion of the spring member shown in FIG. 11.

Further, the lead line 54 of the center conductor 52 is inserted into the ferrite beads 65 and 66, and circular metal caps 67 and 68 are set at the ends of the ferrite beads 65 and 66 respectively. The metal caps 67 and 68 have the same structure, and as shown in FIG. 9, have convex portions 67a and 68a in the center portions. With pressing the convex portions 67a and 68a into open ends of the lead line 54, the metal caps 67 and 68 and the center conductor 52 are connected firmly by soldering, and at the same time, connected electrically. FIG. 10 is an electric equivalent circuit of the feedthrough LC filter 51 which is obtained in this way.

Other Embodiments

In the first embodiment, the spring member holds the ferrite bead. However, the present invention is applicable to an electronic device wherein the spring member holds a doughnut-shaped capacitor.

Also, the shape of the center conductor is optional. For example, the edge 26b of the spring member 24 in the first embodiment does not have to be bent. The cross section of the lead line terminal 30 does not have to be circular, and it can be rectangular or triangular.

Although the present invention has been described in connection with the preferred embodiments above, it is to be noted that various changes and modifications are apparent to a person skilled in the art. Such changes and modifications are to be understood as being within the scope of the present invention.

What is claimed is:

1. A feedthrough electronic device comprising:

an electronic element which has a feedthrough hole; and a center conductor which penetrates the electronic element, the center conductor comprising a lead line portion and a spring portion which has an extended portion protruding from the lead line portion and contacting an inner periphery of the electronic element with pressure;

wherein a width of the extended portion of the spring portion is substantially uniform and a wide portion for preventing deformation is provided at a bottom of the extended portion.

2. A feedthrough electronic device as claimed in claim 1, wherein the extended portion has a bent edge.

3. A feedthrough electronic device comprising:

an electronic element which has a feedthrough hole;

a lead line terminal which penetrates the electronic element; and a spring member which has an extended portion which protrudes from the lead line terminal and contacts an inner periphery of the electronic element with pressure;

wherein a width of the extended portion of the Spring member is substantially uniform and a wide portion for preventing deformation is provided at a bottom of the extended portion.

4. A feedthrough electronic device as claimed in claim 3, wherein the extended portion has a bent edge.

5. A feedthrough electronic device as claimed in claim 3, wherein the electronic element is a ferrite bead.

6. A feedthrough electronic device as claimed in claim 5, further comprising:

a doughnut-shaped capacitor which is provided with an outer periphery electrode and an inner periphery electrode at an outer periphery and an inner periphery respectively, the capacitor being penetrated by the lead line terminal, the lead line terminal and the inner periphery electrode being connected electrically.

7. A feedthrough electronic device as claimed in claim 6, further comprising:

a metal case for containing the lead line terminal, the spring member, the ferrite bead and the doughnut-shaped capacitor, the metal case and the outer periphery electrode of the doughnut-shaped capacitor being connected electrically.

8. A feedthrough electronic device comprising:

an electronic element which has a feedthrough hole; and a center conductor which penetrates the electronic element, the center conductor comprising a lead line portion and a spring portion which protrudes from the lead line portion and contacts an inner periphery of the electronic element with pressure;

wherein a width of the spring portion is substantially uniform and a wide portion for preventing deformation is provided at a bottom of the spring portion.

9. A feedthrough electronic device as claimed in claim 8, wherein the spring portion has a bent edge.

10. A feedthrough electronic device as claimed in claim 8, wherein the electric element is a tubular capacitor which is provided with an outer periphery electrode and an inner periphery electrode at an outer periphery and an inner periphery respectively, the inner periphery electrode and the spring portion of the center conductor being connected electrically.

11. A feedthrough electronic device as claimed in claim 10, further comprising:

a cylindrical ferrite bead, the ferrite bead being penetrated by the lead line portion of the center conductor.

\* \* \* \* \*